United States Patent
Kwon

(10) Patent No.: US 8,872,568 B2
(45) Date of Patent: Oct. 28, 2014

(54) METHOD FOR SETTING OFFSET GAIN OF ANALOG OUTPUT MODULE

(71) Applicant: LSIS Co., Ltd., Anyang-si (KR)

(72) Inventor: Jae Il Kwon, Seoul (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 0 days.

(21) Appl. No.: 14/168,715

(22) Filed: Jan. 30, 2014

(65) Prior Publication Data

US 2014/0266378 A1    Sep. 18, 2014

(30) Foreign Application Priority Data

Mar. 12, 2013  (KR) .................. 10-2013-0026219

(51) Int. Cl.
    *H03L 5/00*    (2006.01)
(52) U.S. Cl.
    USPC ............................ 327/307; 330/9; 341/118
(58) Field of Classification Search
    USPC ................................ 327/307; 330/9; 341/118
    See application file for complete search history.

(56) References Cited

U.S. PATENT DOCUMENTS

| | | | |
|---|---|---|---|
| 5,248,970 A | | 9/1993 | Sooch et al. |
| 5,684,482 A | * | 11/1997 | Galton .......................... 341/144 |
| 6,642,869 B2 | * | 11/2003 | Kuyel et al. ................... 341/120 |
| 6,712,271 B2 | * | 3/2004 | Bianchi ..................... 235/462.25 |
| 6,774,828 B1 | * | 8/2004 | Lee et al. ....................... 341/118 |
| 6,993,441 B1 | * | 1/2006 | Tsyrganovich ................. 702/69 |
| 7,085,663 B1 | * | 8/2006 | Tsyrganovich ................. 702/69 |

OTHER PUBLICATIONS

Korean Intellectual Property Office Application Serial No. 10-2013-0026219, Office Action dated Apr. 22, 2014, 4 pages.

* cited by examiner

*Primary Examiner* — Kenneth B. Wells
(74) *Attorney, Agent, or Firm* — Lee, Hong, Degerman, Kang & Waimey

(57) ABSTRACT

A method for setting an offset gain of analog output module configured to convert a digital signal outputted from an MPU (Micro Processing Unit) to an analog signal and to output the converted analog signal is proposed, the method including outputting, by the MPU, a digital signal value to the analog output module, calculating an offset gain by measuring, by the analog output module, an analog signal value outputted by receipt and conversion of the digital signal value, and entering the measured analog signal value to an offset gain inverse function preset by the MPU, and setting the offset gain of the analog output module as the calculated offset gain.

6 Claims, 3 Drawing Sheets

METHOD FOR SETTING OFFSET GAIN OF ANALOG OUTPUT MODULE

CROSS-REFERENCE TO RELATED APPLICATION

Pursuant to 35 U.S.C. §119(a), this application claims the benefit of earlier filing date and right of priority to Korean Patent Application No. 10-2013-0026219, filed on Mar. 12, 2013, the contents of which is incorporated by reference herein in its entirety.

BACKGROUND OF THE DISCLOSURE

1. Field of the Disclosure

Exemplary aspects of the present disclosure relate to a method for setting an offset gain of an analog output module, configured to accurately set an offset gain of an analog output module outputted to an external load device by changing a digital signal outputted from an MPU (Micro Processing Unit) in a PLC (Programmable Logic Controller) to an analog signal.

2. Description of Related Art

Apparatuses for factory automation of various types have emerged concomitant with technical development of automation fields owing to sophisticated technologies. Particularly, a PLC (Programmable Logic Controller) system is a core element for factory automation configured to control various types of equipment, machines and processes in a factory, and effective means configured to satisfy various requirements for factory automation.

The PLC system uses programmable memories for implementing various functions such as logic, sequence, timing, counting and computing through digital or analog input/output modules. The PLC system is mounted with an analog output module for control by being connected to an external load device that operates in response to an analog signal. The analog output module functions to convert a digital signal outputted from an MPU (Micro Processing Unit) to an analog signal, and output the converted analog signal to an external load device.

The analog output module must accurately set an offset gain for calibrating an intrinsic error of the analog output module for accurately controlling the external load device for the analog output module. To this end, a conventional PLC system employed a method of inputting offset gains of various output scopes by anticipating, by an operator, the offset gains in response to values of analog signals outputted by the analog output module.

FIG. 1 is a block diagram illustrating a configuration of a general analog output module, where reference numeral 100 is an MPU (Micro Processing Unit). The MPU (100) functions to generate a digital signal for controlling an operation of an external load device (not shown).

The digital signal generated by the MPU (100) is converted to an analog signal by being inputted to a plurality of analog output units (110) having a plurality of channels, where the converted analog signal is transmitted to an external load device to operate a load device. Each of the plurality of analog output units (110) may include a photo coupler (112), a DAC (Digital to Analog Converter 114), a voltage amplifier (116) and a current amplifier (118).

The photo coupler (112) receives a digital signal outputted by the MPU (100) in a state of being insulated from the MPU (100), where the received digital signal is converted by the DAC (114) to an analog signal. The analog signal converted by the DAC (114) is amplified by the voltage amplifier (116) or the current amplifier (118) and transmitted to an external load device.

That is, the analog voltage signal converted by the DAC (114) is amplified by the voltage amplifier (116) to be transmitted to the external load device, and the analog current signal converted by the DAC (114) is amplified by the current amplifier (118) to be transmitted to the external load device.

FIG. 2 is a signal flowchart illustrating a setting operation of offset gain according to the prior art. Referring to FIG. 2, the MPU (100) first determines whether an analog output module is in a mode for setting an offset gain (S200). As a result of the determination, if it is determined that the analog output module is in the mode for setting an offset gain, the MPU (100) selects an analog output module (110) for setting an offset gain from the plurality of analog output modules (110) having a plurality of channels (S202).

If the one analog output module (110) for setting an offset gain is selected, the MPU (100) performs an initialization operation of the DAC (114) mounted on the analog output module (110) of relevant channel (S204).

Furthermore, the MPU (100) computes a value of a digital signal to be outputted to the analog output module (110) of relevant channel by using a value set on the analog output module (110) of relevant channel for setting an offset gain and an offset gain current set on the analog output module (110) of relevant channel (S206).

If the value of the digital signal is computed, the MPU (100) outputs the computed value of digital signal to the analog output module (110) of relevant channel (110) (S208).

The digital signal outputted by the MPU (100) is insulated and received by the photo coupler (112) mounted on the analog output module (110). Furthermore, the digital signal received by the photo coupler (112) is converted to an analog signal by the DAC (114), and outputted by being voltage-amplified and current-amplified by the voltage amplifier (116) and the current amplifier (118) respectively.

Under these circumstances, an operator measures the value of analog signal outputted by the voltage amplifier (116) and the current amplifier (118) using a meter (S210), and determines whether the measured value of analog signal satisfies a value within an error range (S212).

As a result of determination, if it is determined that the measured value of analog signal fails to satisfy the value within an error range, the operator predicts an offset gain by using the measured value of analog signal, and the predicted offset gain is inputted and set through a ladder program, for example, (S214).

Under these circumstances, the MPU (100) returns to S206 to compute a value of digital signal using a value set on the analog output module (110) of relevant channel and an offset gain newly set on the analog output module (110) of relevant channel and outputs the computed value, where the operator measures a value of an analog signal using a meter and determines whether the value satisfies a condition within an error range, and predicts and sets an offset gain if the value fails to satisfy the condition within the error range, where predicting and setting operations of offset gain are repeated.

However, chances are that the operations of predicting and setting the offset gains using the value of analog signal outputted by the analog output module (110) are frequently repeated due to erroneous input of offset gains by an operator to increase operation time of setting the offset gains and to disadvantageously decrease accuracy of set offset gains.

SUMMARY OF THE INVENTION

Exemplary aspects of the present disclosure are to substantially solve at least the above problems and/or disadvantages and to provide at least the advantages as mentioned below. Thus, the present disclosure is directed to provide a method for setting an offset gain of analog output module, configured to prevent an operator prediction error by automatic setting of offset gain using an offset gain inverse function, to reduce an operation time for setting an offset gain, and to improve control performance and stability of an external load device operated by an analog signal.

Technical problems to be solved by the present disclosure are not restricted to the above-mentioned descriptions, and any other technical problems not mentioned so far will be clearly appreciated from the following description by those skilled in the art.

In one general aspect of the present invention, there is provided a method for setting an offset gain of analog output module configured to convert a digital signal outputted from an MPU (Micro Processing Unit) to an analog signal and to output the converted analog signal, the method comprising:

outputting, by the MPU, a digital signal value to the analog output module; calculating an offset gain by measuring, by the analog output module, an analog signal value outputted by receipt and conversion of the digital signal value, and entering the measured analog signal value to an offset gain inverse function preset by the MPU; and setting the offset gain of the analog output module as the calculated offset gain.

Preferably, but not necessarily, the step of outputting the digital signal value may include outputting the digital signal value to the analog output module, when the MPU determines the setting of the calculated offset gain as an offset gain set mode.

Preferably, but not necessarily, the analog output module may include a plurality of channels, wherein the step of outputting the digital signal value includes outputting the digital signal value to one of the selected analog output modules by selecting one analog output module of one channel from the analog output modules having a plurality of channels.

Preferably, but not necessarily, the digital signal value may be computed by using a setting value set on the analog output module and a currently-set offset gain.

Preferably, but not necessarily, the step of computing the offset gain may include calculating a voltage offset gain and a current offset gain using the following Equations 1 and 2:

$$F_v(m) = 2^{(n-1)} - (m - S_v) \times \left(\frac{2^n - 1}{2 \times R_v \times 10^3}\right) \quad \text{[Equation 1]}$$

$$F_c(m) = 2^{(n-1)} - (m - S_c) \times \left(\frac{2^n - 1}{2 \times R_c \times 10^3}\right) \quad \text{[Equation 2]}$$

where, $F_v(m)$ is a voltage offset gain, $F_c(m)$ is a current offset gain, m is an experimental value of an analog signal measured by a meter ($\mu$V or $\mu$A unit), n is a resolution (number of total bits) of a DAC, $S_v$ is a standard offset gain voltage, $S_c$ is a standard offset gain current, $R_v$ is an output range of analog voltage signal, and $R_c$ is an output range of analog current signal.

Preferably, but not necessarily, the step of calculating the offset gain may include measuring the analog signal value by using a meter connected to the MPU and an voltage amplifier and a current amplifier of the analog output module, and inputting the measured analog signal value to the MPU.

In an advantageous effect according to the method for setting an offset gain of analog output module, an offset gain of an analog output module can be automatically calculated using an offset gain inverse function, and the calculated offset gain is set as an offset gain of the analog output module, whereby an offset gain can be simply set using the offset gain of the analog output module free from an operator's one-by-one manual manipulation, and a set time of offset gain can be reduced.

BRIEF DESCRIPTION OF THE DRAWINGS

Now, exemplary embodiments of the present disclosure will be described in detail with reference to the accompanying drawings, where the like reference numerals will be assigned to the like elements in the explanations of some figures.

DETAILED DESCRIPTION OF PREFERRED EMBODIMENTS

The present disclosure is herein described, by way of example only, with reference to the accompanying drawings. The present disclosure is presented in the cause of providing what is believed to be the most useful and readily understood description of the principles and conceptual aspects of the disclosure. In this regard, no attempt is made to show structural details of the invention in more detail than is necessary for a fundamental understanding of the disclosure and the description is taken with the drawings making apparent to those skilled in the art how the several forms of the invention may be embodied in practice.

Figure 2:
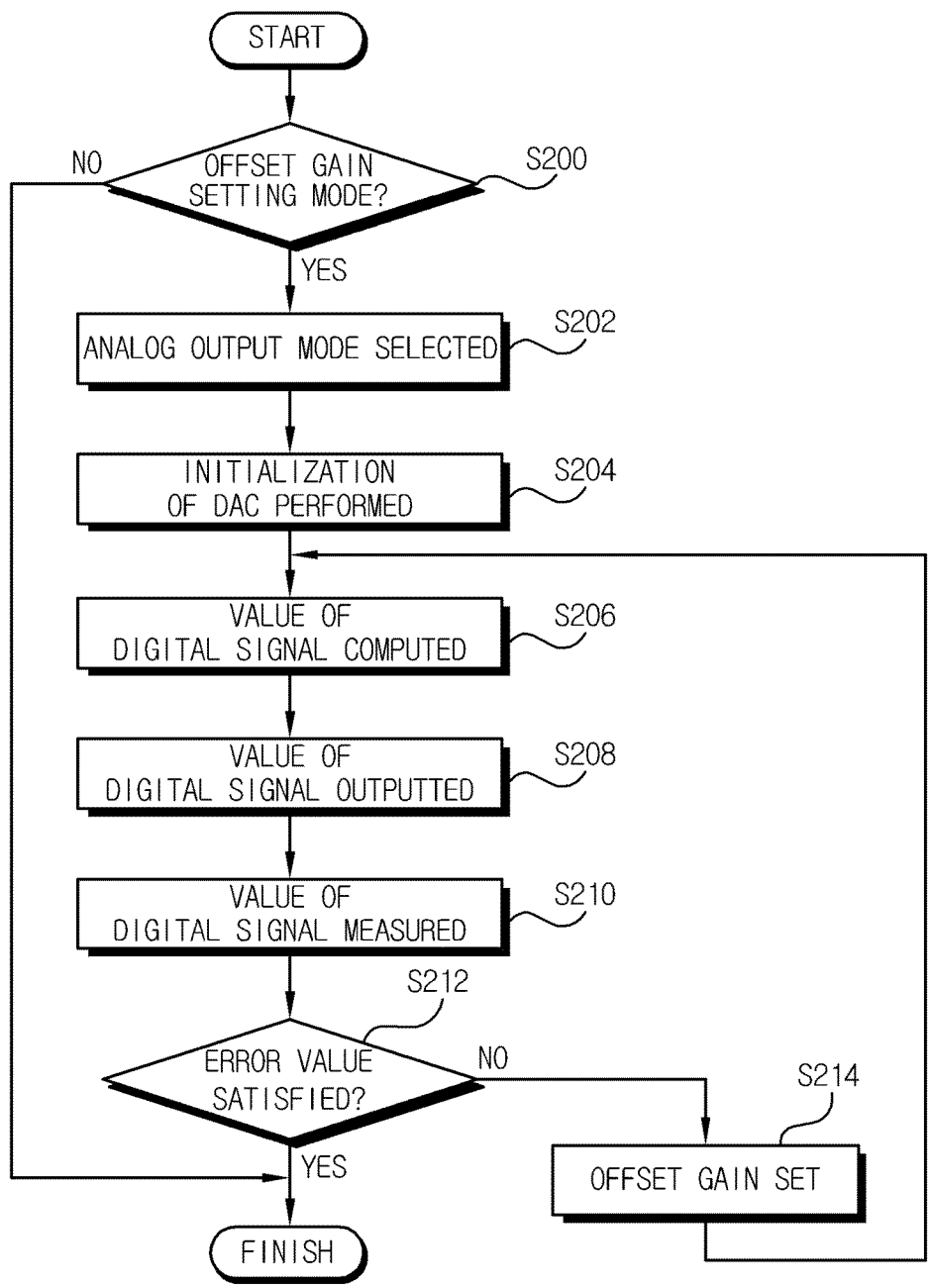
FIG. 2 is a signal flowchart illustrating a setting operation of an offset gain according to prior art.
Figure 3:
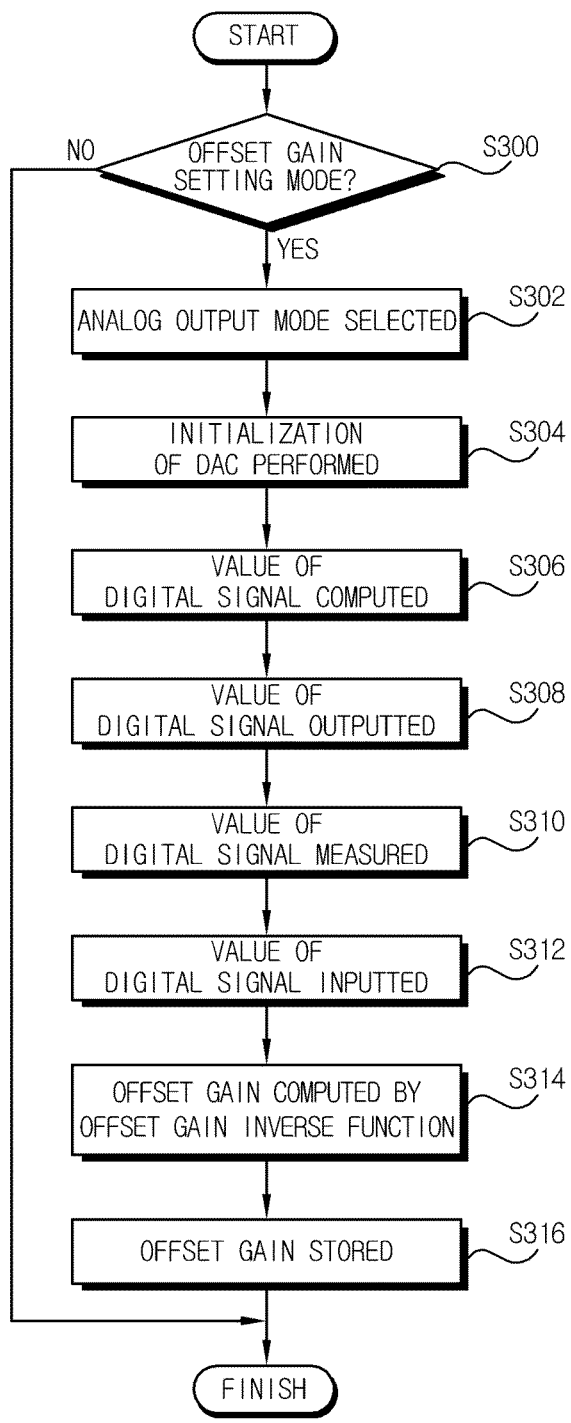
FIG. 3 is a signal flowchart illustrating a setting operation of an offset gain according to the present disclosure.

FIG. 3 is a signal flowchart illustrating a setting operation of an offset gain according to the present disclosure, and hereinafter, the method for setting an offset gain of analog output module will be described with reference to FIGS. 1 and 2 that illustrate configuration of analog output module.

Figure 1:
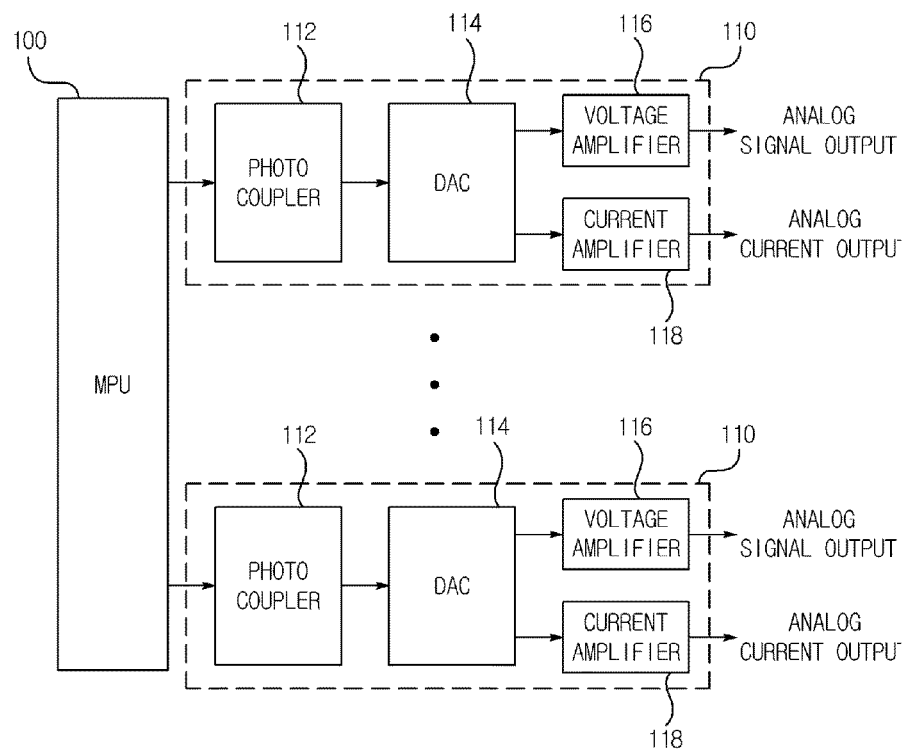
FIG. 1 is a block diagram illustrating a configuration of a general analog output module.

Referring to FIGS. 1 and 2, an MPU (100) determines whether the analog output module is in an offset gain setting mode for setting an offset gain (S300). As a result of determination, if it is determined that the analog output module is in the offset gain setting mode, the MPU (100) selects one analog output module (110) of one channel configured to set an offset gain from the analog output modules of a plurality of channels (S302).

When one analog output module (110) of one channel configured to output an analog signal is selected, the MPU (100) performs an initialization operation of a DAC (114) mounted on the analog output module (110) of relevant channel (S304). The MPU (100) computes a value of a digital signal to be outputted to the analog output module (110) of relevant channel by using a setting value set on the analog output module (110) of relevant channel for setting an offset gain and an offset gain currently set on the analog output module (110) of relevant channel (S306).

When the value of digital signal is computed, the MPU (100) outputs the computed value of digital signal to the analog output module (110) of relevant channel (S308).

Under these circumstances, a value of an analog signal outputted from a voltage amplifier (116) and a current amplifier (118) is measured by a meter (S310), and the value of analog signal measured by the meter is inputted to the MPU (100) (S312).

At this time, an operator may manually perform the operations of measuring the value of analog signal and inputting the measured value of analog signal.

Furthermore, the operations of measuring the value of analog signal and inputting the measured value of analog signal may be automatically performed, where the meter may be connected to the MPU (100), the voltage amplifier (116) and the current amplifier (118), a value of analog signal outputted by the voltage amplifier (116) and the current amplifier (118) may be measured by the meter, and the measured value of analog signal may be inputted to the MPU (100).

When the value of analog signal outputted by the voltage amplifier (116) and the current amplifier (118) is inputted to the MPU (100), the MPU (100) computes an offset gain by implementing an offset gain inverse function (S314).

At this time, the offset gain may be computed by using an offset gain voltage inverse function, Equation 1, for example, for inversely computing an offset gain within an output range of analog voltage signal, and an offset gain current inverse function, Equation 2, for example, for inversely computing an offset gain within an output range of analog current signal.

$$F_v(m) = 2^{(n-1)} - (m - S_v) \times \left( \frac{2^n - 1}{2 \times R_v \times 10^3} \right) \qquad \text{[Equation 1]}$$

$$F_c(m) = 2^{(n-1)} - (m - S_c) \times \left( \frac{2^n - 1}{2 \times R_c \times 10^3} \right) \qquad \text{[Equation 2]}$$

where, $F_v(m)$ is a voltage offset gain, $F_c(m)$ is a current offset gain, m is an experimental value of an analog signal measured by a meter (μV or μA unit), n is a resolution (number of total bits) of a DAC, $S_v$ is a standard offset gain voltage, $S_c$ is a standard offset gain current, $R_v$ is an output range of analog voltage signal, and $R_c$ is an output range of analog current signal.

When the voltage offset gain and the current offset gain are computed by using the Equations 1 and 2, the MPU (100) stores and sets the computed voltage offset gain and current offset gain (S316), and finishes the operation of setting the offset gain.

Although exemplary embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. A method for setting an offset gain of at least one analog output module configured to convert a digital signal outputted from an MPU (Micro Processing Unit) to an analog signal and to output the converted analog signal, the method comprising:
    outputting, by the MPU, a digital signal value to the analog output module;
    calculating an offset gain by measuring, by the analog output module, an analog signal value outputted by receipt and conversion of the digital signal value, and entering the measured analog signal value to an offset gain inverse function preset by the MPU; and
    setting the offset gain of the analog output module as the calculated offset gain.

2. The method of claim 1, wherein the step of outputting the digital signal value includes outputting the digital signal value to the at least one analog output module, when the MPU determines the setting of the calculated offset gain as an offset gain set mode.

3. The method of claim 1, wherein the at least one analog output module includes a plurality of analog output modules each having a respective channel, wherein the step of outputting the digital signal value includes outputting the digital signal value to a selected one of the plurality of analog output modules.

4. The method of claim 1, wherein the digital signal value is calculated by using a setting value set on the analog output module and a currently-set offset gain.

5. The method of claim 1, wherein the step of calculating the offset gain includes calculating a voltage offset gain and a current offset gain using the following Equations 1 and 2:

$$F_v(m) = 2^{(n-1)} - (m - S_v) \times \left( \frac{2^n - 1}{2 \times R_v \times 10^3} \right) \qquad \text{[Equation 1]}$$

$$F_c(m) = 2^{(n-1)} - (m - S_c) \times \left( \frac{2^n - 1}{2 \times R_c \times 10^3} \right) \qquad \text{[Equation 2]}$$

where, $F_v(m)$ is a voltage offset gain, $F_c(m)$ is a current offset gain, m is an experimental value of an analog signal measured by a meter (μV or μA unit), n is a resolution (number of total bits) of a DAC, $S_v$ is a standard offset gain voltage, $S_c$ is a standard offset gain current, $R_v$ is an output range of an analog voltage signal, and $R_c$ is an output range of an analog current signal.

6. The method of claim 1, wherein the step of calculating the offset gain includes measuring the analog signal value by using a meter connected to the MPU and a voltage amplifier and a current amplifier of the at least one analog output module, and inputting the measured analog signal value to the MPU.

\* \* \* \* \*